US008669830B2

(12) United States Patent
Lin

(10) Patent No.: US 8,669,830 B2
(45) Date of Patent: Mar. 11, 2014

(54) METHOD AND DEVICE FOR ROUTING OVER A VOID FOR HIGH SPEED SIGNAL ROUTING IN ELECTRONIC SYSTEMS

(75) Inventor: Shengli Lin, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 414 days.

(21) Appl. No.: 13/006,643

(22) Filed: Jan. 14, 2011

(65) Prior Publication Data

US 2012/0182082 A1 Jul. 19, 2012

(51) Int. Cl.
*H03H 7/38* (2006.01)
(52) U.S. Cl.
USPC ............................................................ 333/34
(58) Field of Classification Search
USPC ........................................ 333/33, 34, 236, 246
See application file for complete search history.

(56) References Cited

U.S. PATENT DOCUMENTS

| 7,106,145 | B2 | 9/2006 | Hsu et al. | |
| 2004/0263181 | A1* | 12/2004 | Ye et al. | 324/534 |
| 2009/0015345 | A1* | 1/2009 | Kushta et al. | 333/34 |

* cited by examiner

*Primary Examiner* — Stephen Jones
(74) *Attorney, Agent, or Firm* — Sterne, Kessler, Goldstein & Fox P.L.L.C.

(57) ABSTRACT

Embodiments of the present invention are directed to providing an increased trace width when traversing a void in another layer in a printed circuit board or package design. By increasing the trace width or alternatively increasing the capacitance, the degradation due to the void can be reduced. This approach works for microstrip, stripline as well as other transmission lines that use a reference plane. The void can be the result of an antipad associated with a via, or any other disruption in an otherwise uniform reference plane.

20 Claims, 7 Drawing Sheets

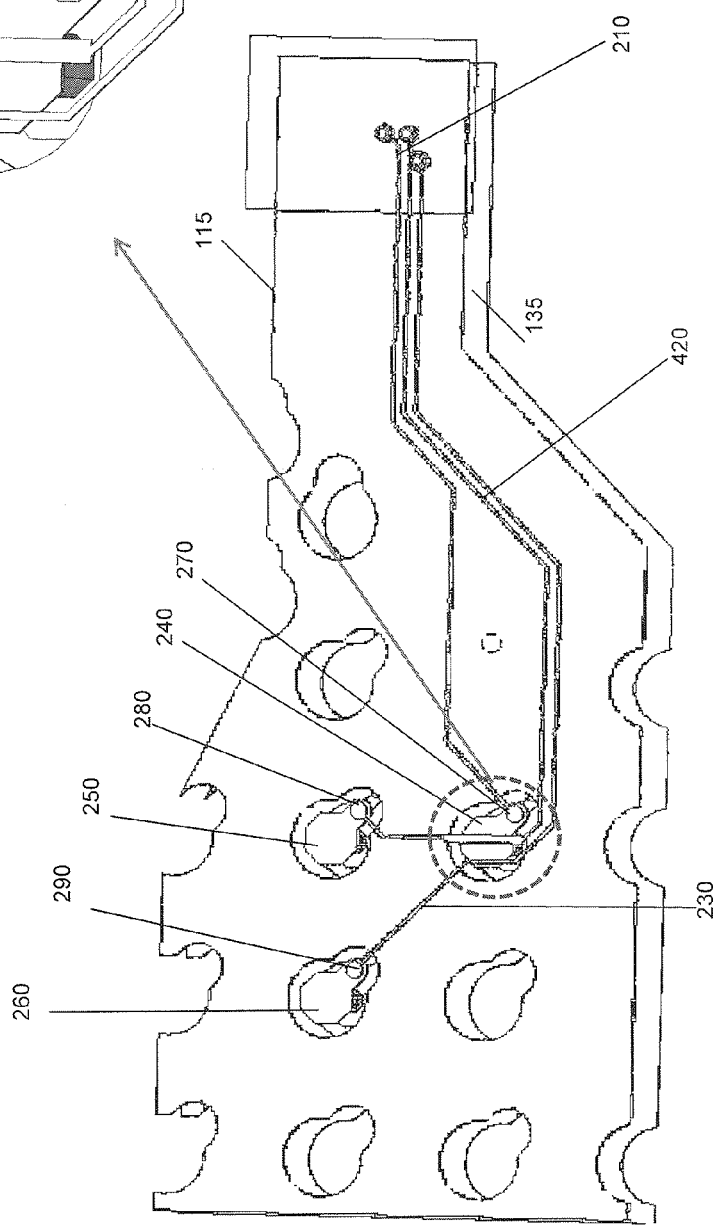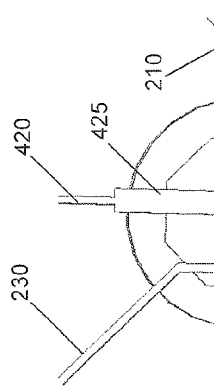

METHOD AND DEVICE FOR ROUTING OVER A VOID FOR HIGH SPEED SIGNAL ROUTING IN ELECTRONIC SYSTEMS

BACKGROUND

1. Field of the Invention

The present invention relates generally to circuit boards and packages in communication systems, and in particular to structures and methods for routing over a void for high speed signal routing in communication systems.

2. Background Art

Data transmission speed requirements have dramatically increased over recent years. Electronic systems typically use printed circuit boards and/or packages that are interconnected to produce various functionalities of the data transmission process. Each printed circuit board or package contains one or more layers upon which components are placed. Connectivity between the components proceeds by way of conductive paths that are commonly referred to as metal traces, or just traces. Traces are formed on a number of metal layers that form a part of the printed circuit boards and/or packages. In high speed circuit design, the most commonly used transmission lines for these traces are microstrip and stripline. Both of these transmission lines require a uniform reference plane to ensure the integrity of the signals that propagate along the transmission lines.

In high density interconnect situations, a large number of circuit layers are required to provide the desired large number of connections. In such situations, the circuit board or package often contains a rigid core layer so as to provide the required stability and rigidity. Thin layers that form the desired circuit layers are applied on one or both sides of the rigid core layer in order to provide the required stack-up of the circuit board or package to meet the interconnect requirements.

Vias (or plated through holes) provide electrical (and at times thermal) connectivity between the layers of a printed circuit board or package. Vias can be of different size diameters based on factors such as the interlayer distance involved. For example, a via that passes through the thick core of the printed circuit or package is larger in diameter than another via that passes from one thin circuit layer to its adjacent thin circuit layer.

Thick core vias provide transmission of signal, ground or power through the core in the circuit board or package. However, the use of vias results in voids on reference planes used for the transmission lines. For example, the anti-pad associated with a via will cause a void. An antipad is an absence of metal on a layer in the vicinity of the via. In the two metal layers that are disposed just above and below the core layer, there are typically numerous big voids due to the large antipad size requirements of the thick vias passing through the core layer.

As a consequence, practical circuit board and package design must deal with imperfections such as the voids that result from the presence of antipads associated with vias. In the case of a void in a reference plane, the void disrupts the uniformity of a reference plane, and therefore transmission lines that are routed over a void ("routing-over-void") are degraded in performance. For example, the presence of via antipads results in a change to the impedance of a signal trace in the immediate vicinity of the void. Impedance changes of transmission lines result in reflections, degradation in signal trace propagation performance and can, under certain circumstances, result in interconnection failures.

Increased data transmission speed requirements and the need for reduced circuit board size and reduced package size place an emphasis improving the density of trace routing within the circuit board or package. Smaller circuit board size and smaller package size requires maximization of the utilization of all available real estate on the circuit layers of the printed circuit board and package.

Current design practice dictates that traces not be routed in the area below or above a void in order to eliminate the signal propagation degradation associated with the void. However, such a design practice reduces routing density and therefore leads to an increase in the number of stack-up layers and/or increased circuit board/package dimension. Such increases in turn result in an undesired increase in product cost.

BRIEF SUMMARY

What is needed is a structure and method to reduce the impact of routing over void so that increased routing densities can be achieved in printed circuit and package design. In addition, it is desirable that such a structure and method not impose any significant additional technical or quality assurance challenges in the printed circuit and package design and layout process. It is further desirable that the device and method not impose any significant additional costs to the finished printed circuit board and/or package.

In one embodiment of the present invention, the width of a trace is increased for the length of the void. After traversing the void area, the trace width returns to its normal width. Such an increase in trace width results in a corresponding decrease of the degradation in trace performance resulting from the void, and therefore results in an increase of the signal integrity of signals used in high speed circuitry. Compared with the traditional routing-over-void approach, embodiments of the present invention result in a smaller return loss over a broad frequency range. In addition, a larger "eye opening" is provided in the time domain of data signal.

In other embodiments of the present invention, different shapes of transmission line adjustment can be deployed in the vicinity of the void. Such different transmission line shapes include non-rectangular increases to trace width. Other transmission line shapes include shapes that are deployed in the vicinity of the void to offset the localized impedance change resulting from the reference plane void. Various embodiments of the present invention also include localized changes to transmission line shapes to offset reference plane discontinuities other than those associated with antipad voids.

Structures and methods associated with the present invention result in superior signal integrity, a straightforward implementation within current design methodology, no added cost to the existing design flow and tool set, and finally a lower product cost. Embodiments of the present invention can be applied to any high speed, high density package or printed circuit design to address discontinuities in reference planes that support transmission lines for high speed signal propagation.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings. In the drawings, like reference numbers indicate identical or functionally similar elements.

FIG. 4 depicts a perspective view of trace routing over a reference plane containing voids associated with vias, in accordance with an embodiment of the present invention.

Figure 7:
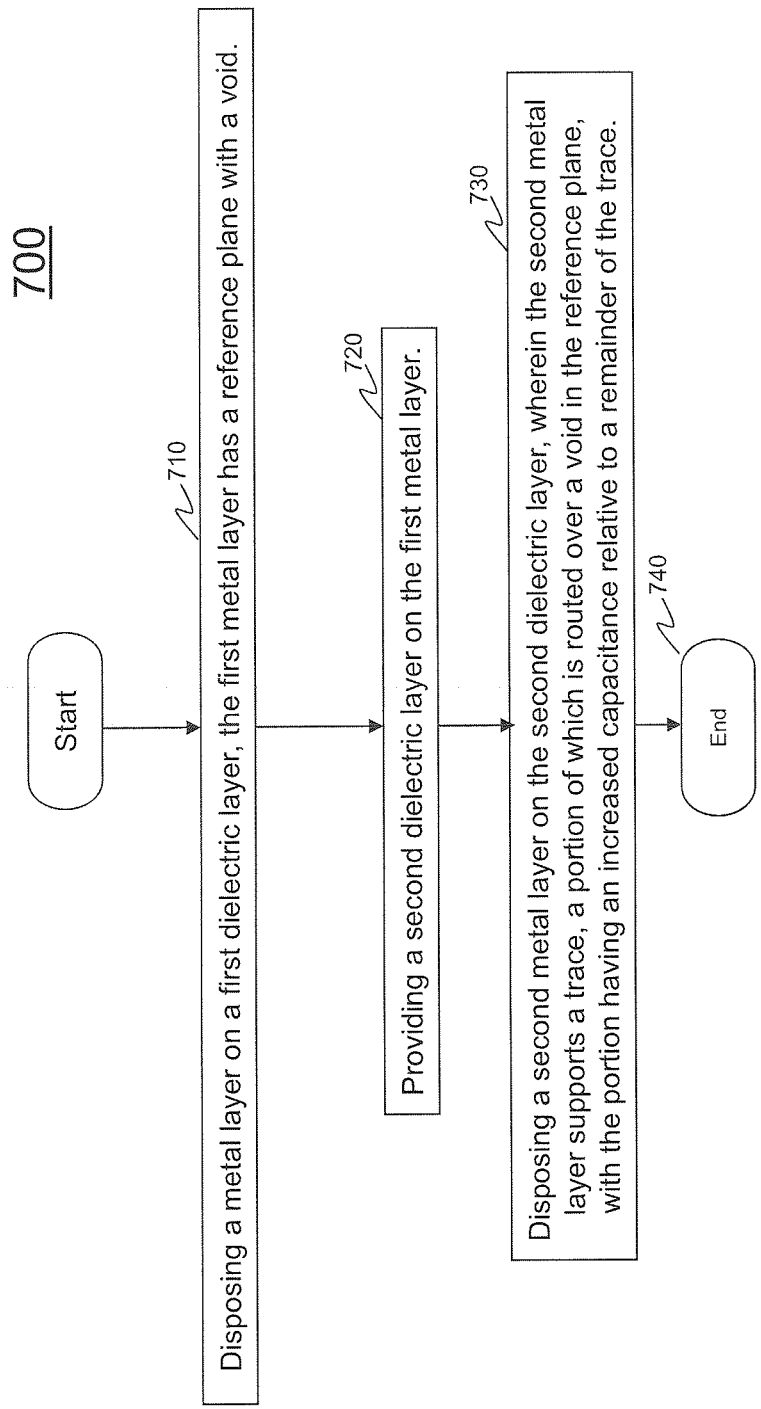

FIG. 7 provides a flowchart of a method that provides an improved impedance match for a routing-over-via, according to an embodiment of the current invention.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
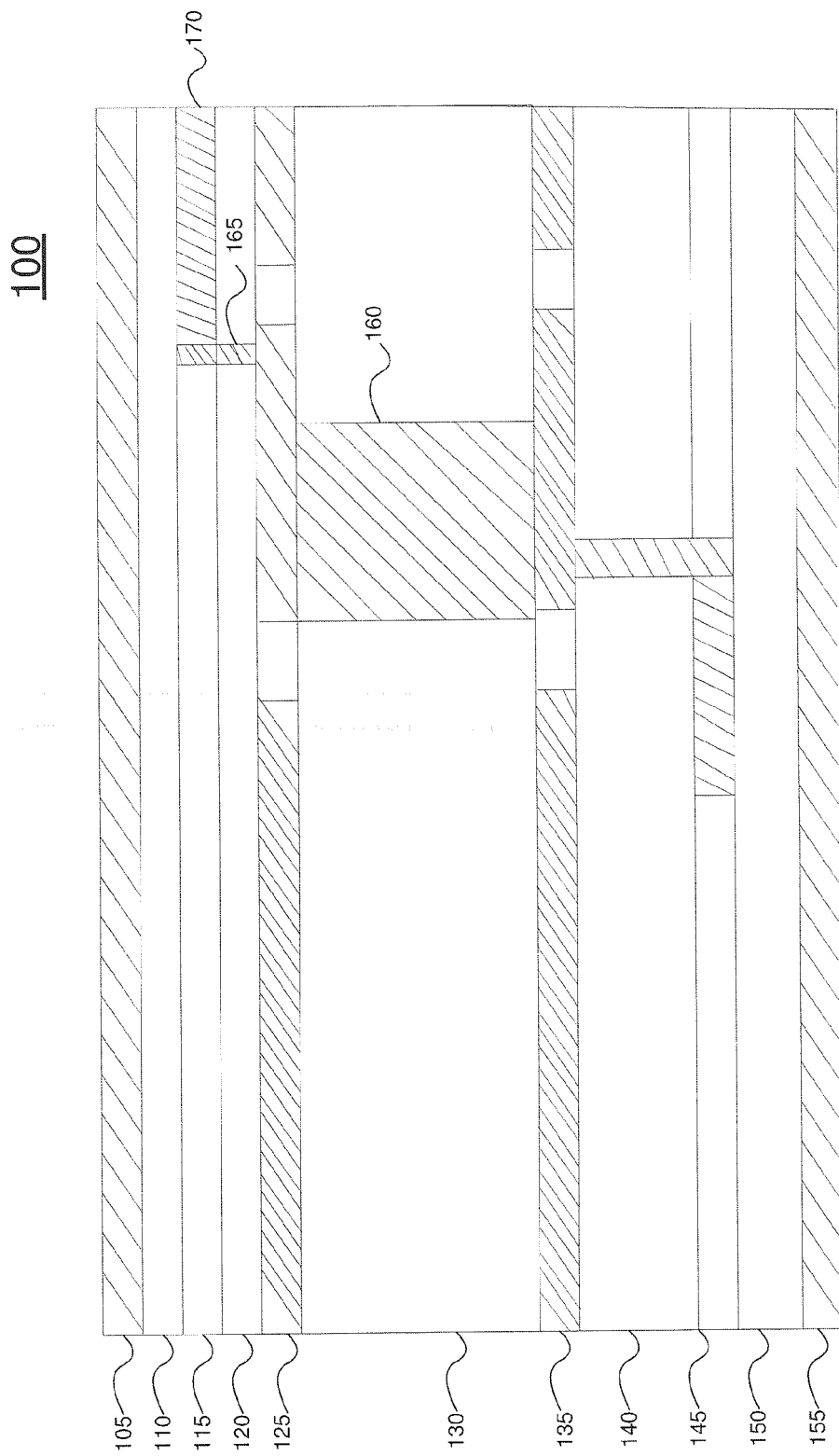
FIG. 1 depicts a cross-section of a package with vias.

FIG. 1 depicts a cross-section of a package 100. The ball grid array (BGA) balls of package are not displayed. Package 100 contains a core layer 130 of dielectric material. On either side of core layer 130 are two metal layers 125, 135 that are designated as reference layers for associated signal trace layers 115, 145. Additional reference layers 105, 155 are also provided for signal trace layers 115, 145 respectively. Dielectric layers 110, 120 separate signal trace layer 115 from its respective reference layers 105, 125. Similarly, dielectric layers 140, 150 separate signal trace layer 145 from its respective reference layers 135, 155. In this configuration, signal trace layers 115, 145 operate in a stripline transmission line mode since the signal trace layers are sandwiched between two reference planes.

FIG. 1 also depicts via 160 that traverses core layer 130. Via 160 can handle signal types such as ground, signal or power. FIG. 1 also illustrates a further connection from via 160 through via 165 to signal trace 170 on signal trace layer 115. Similarly, there can be other vias that distribute ground, signal or power to other layers of printed circuit board 100.

Figure 2:
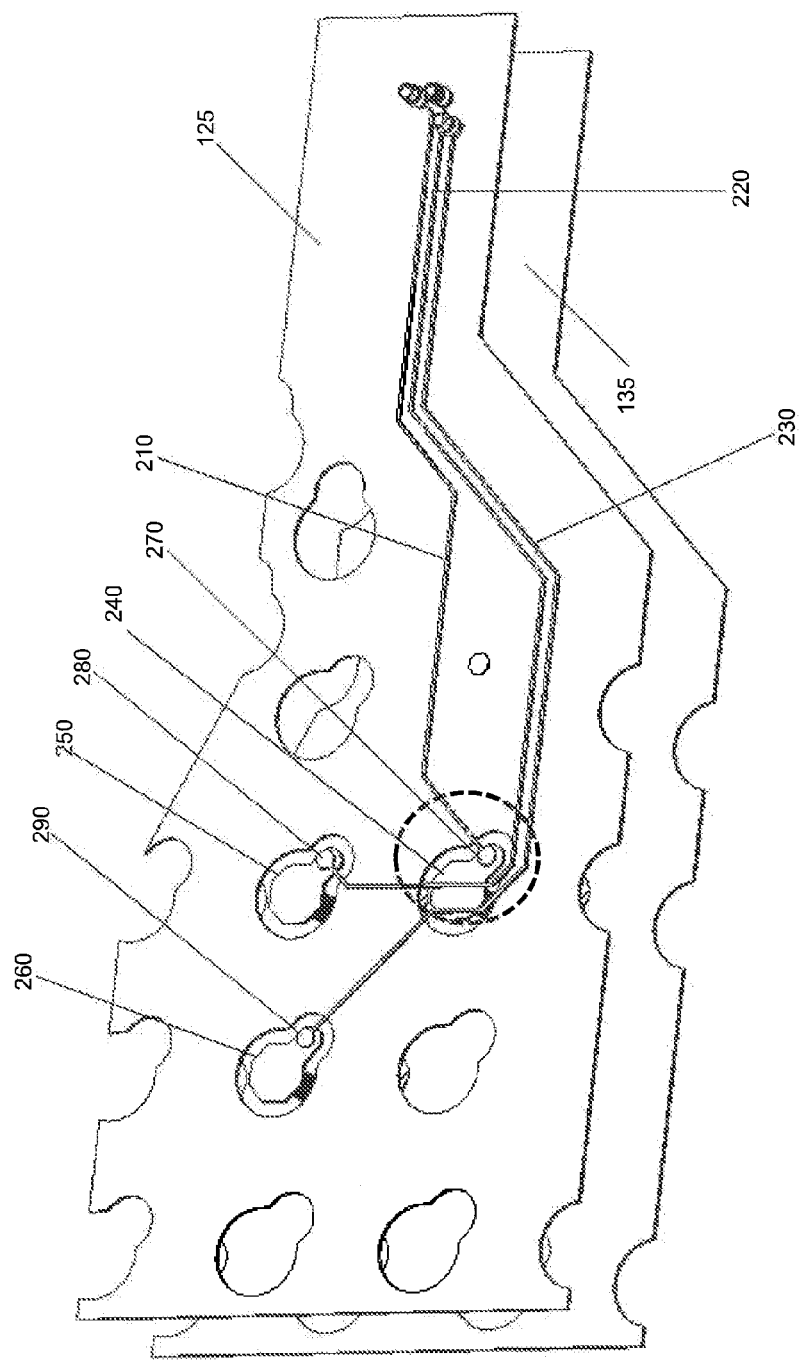
FIG. 2 depicts a perspective view of package trace routing over a reference plane containing voids associated with vias.

FIG. 2 depicts a traditional approach to the challenge of routing-over-voids. Traces 210, 220, 230 are shown routed on signal trace layer 115. Referring back to FIG. 1, signal trace layer 115 is located on top of dielectric layer 120, which in turn is located on top of reference layer 125. For ease of illustration, dielectric layer 120 is not shown in FIG. 2. FIG. 2 shows reference layer 125 (shaded layer) in which antipads are shown that surround vias 240, 250, 260. Trace 210 is routed on signal trace layer 115 to via 270. In turn, via 270 is connected on reference layer 125 to via 240. Similarly, trace 220 is routed on signal trace layer 115 to via 280. In turn, via 280 is connected on reference layer 125 to via 250. Also, similarly trace 230 is routed on signal trace layer 115 to via 290. In turn, via 290 is connected on reference layer 125 to via 260. However, traces 220, 230 are routed over the location where a void associated via 240 is located. The void is the hole in reference layer 125 formed in the vicinity of via 240, as shown in FIG. 2. (Note that the dashed circle around via 240 is provided for illustration only, and is not functional.) The resulting discontinuity in the uniformity of reference plane 125 results in a localized impedance mismatch of traces 220, 230, and a resulting degradation in signal integrity when using traces 220, 230. The voids associated with the vias preclude the reference plane 125 from providing a uniform metal planar layer, which causes trace signals to see an impedance mismatch at the void locations when using a conventional layout.

Figure 3:
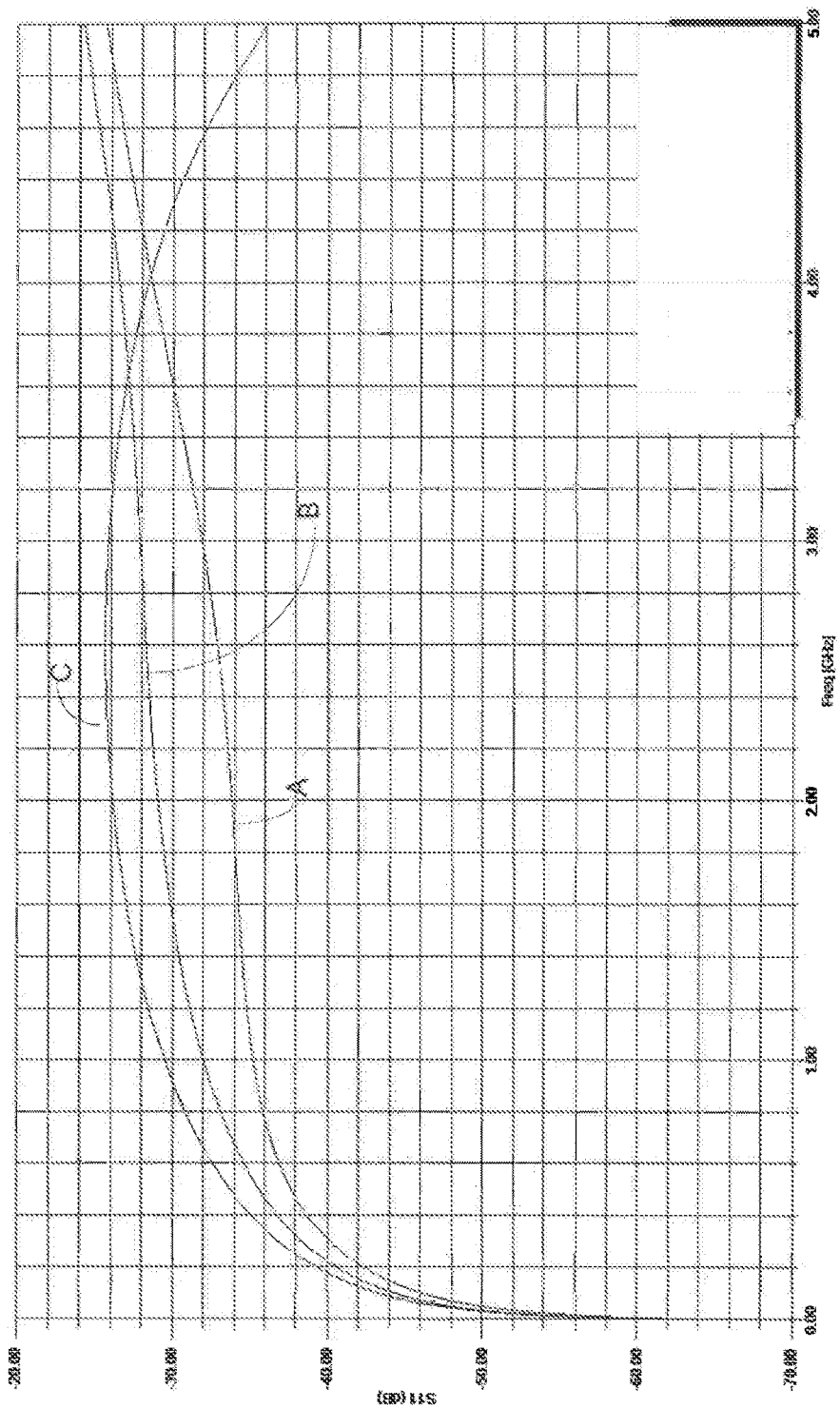
FIG. 3 depicts the reflection loss for three trace routings over a reference plane containing voids associated with vias.

FIG. 3 depicts the return loss for the trace routing of traces 210, 220, 230 over reference plane 125 containing the void associated with via 240. Simulations have been performed for this configuration of traces. Without the benefit of embodiments of the present invention, simulated return losses of traces 210, 220, 230 are illustrated by curves A, B and C in FIG. 3. Thus, curve A illustrates the return loss of a trace (i.e., trace 210) that has been routed so that it does not encounter any voids in reference plane 125. Similarly, curve B illustrates the return loss of a trace (i.e., trace 220) that has been routed over a void associated with via 240. Finally, curve C illustrates the return loss of a trace (i.e., trace 230) that has also been routed over a void associated with via 240. Trace 220 differs from trace 230 in that the routing of trace 230 traverses a lesser portion of the void associated with via 240, than that traversed by trace 220. As would be expected, the trace (i.e., trace 210) routed over reference plane 125 without encountering any voids along the routing path provides the best return loss (curve A) of all three routing scenarios over most of the frequency range.

FIG. 4A depicts a novel approach to the routing-over-void challenge, using an embodiment of the present invention. Traces 210, 420, 230 are shown routed on signal trace layer 115. Referring back to FIG. 1, signal trace layer 115 is located on top of dielectric layer 120, which in turn is located on top of reference layer 125. For ease of illustration, dielectric layer 120 is not shown in FIG. 4A. FIG. 4A shows reference layer 125 (shaded layer) in which antipads are shown that surround vias 240, 250, 260. Trace 210 is routed on signal trace layer 115 to via 270. In turn, via 270 is connected on reference layer 125 to via 240. Similarly, trace 420 is routed on signal trace layer 115 to via 280. In turn, via 280 is connected on reference layer 125 to via 250. Also, similarly trace 230 is routed on signal trace layer 115 to via 290. In turn, via 290 is connected on reference layer 125 to via 260. As shown, traces 420, 230 are routed over the location where a void associated via 240 is located.

In contrast to the traditional routing-over-void approach, this embodiment of the present invention increases the trace width in the lateral direction of the trace 420 while traversing the underlying void 240 on the associated reference layer. (Note that the dashed circle around via 240 is provided for illustration only, and is not functional.) By increasing the trace width 425 (see FIG. 4B) in the lateral direction, the local impedance of trace 420 is decreased relative to the trace impedance associated with the nominal trace width. Alternatively, one of ordinary skill in the art can view the increased trace width as causing the local equivalent capacitance of the trace to be increased over the void relative to that of a trace having a nominal trace width. The increase in trace width results in a portion of the trace having a rectangular polygon of increased width, with the rectangular polygon length to be selected. The length of the widened trace width can be selected to be substantially the same as the length of the trajectory that passes directly over the underlying void.

FIG. 4B illustrates in more detail the traversal of traces 420, 230 across the void associated with via 240, and the increased trace width 425 of trace 420. For comparison purposes, trace 230 in FIGS. 4A and 4B does not use an embodiment of the present invention, and therefore maintains the same width as the traditional routing-over-void approach that is illustrated by trace 230 in FIG. 2.

Figure 5:
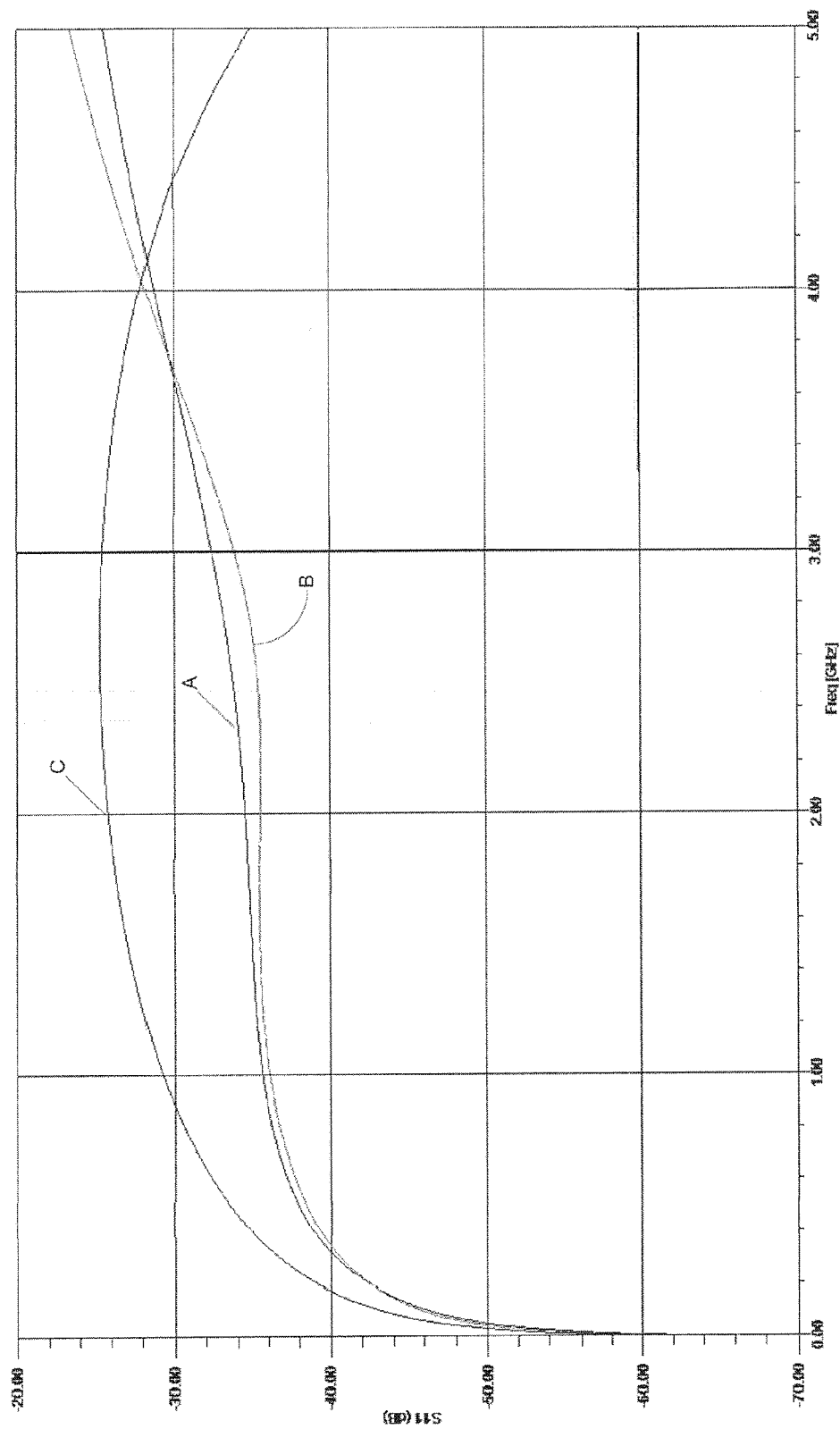
FIG. 5 depicts the return loss for three trace routings over a reference plane containing voids associated with vias, with one trace routing using an embodiment of the present invention.

FIG. 5 depicts return loss for the trace routing of traces 210, 420, 230 over reference plane 125, in accordance with an embodiment of the present invention. Simulations have been performed for this configuration of traces. Simulated return losses of traces 210, 420, 230 are illustrated by curves A, B and C in FIG. 3. As known by one of ordinary skill in the art, a trace having a lower return loss represents superior performance than a higher return loss as a lower return loss is associated with a higher level of signal transmission along the trace. Thus, curve A illustrates the return loss of a trace (i.e., trace 210) that has been routed so that it does not encounter any voids in reference plane 125. Curve B illustrates the return loss of a trace (i.e., trace 420) that has been routed over a void associated with via 240, but includes an embodiment of the present invention. Finally, curve C illustrates the return loss of a trace (i.e., trace 230) that has also been routed over a void associated with via 240, but does not include an embodiment of the present invention. As before, trace 420 differs from trace 230 in that the routing of trace 230 traverses a lesser portion of the void associated with via 240, than that traversed by trace 420. FIG. 5 indicates that the return loss of trace 420 is now comparable to the return loss of trace 210, where trace 210 is routed over reference plane 125 without encountering any voids along the routing path.

Figure 6:
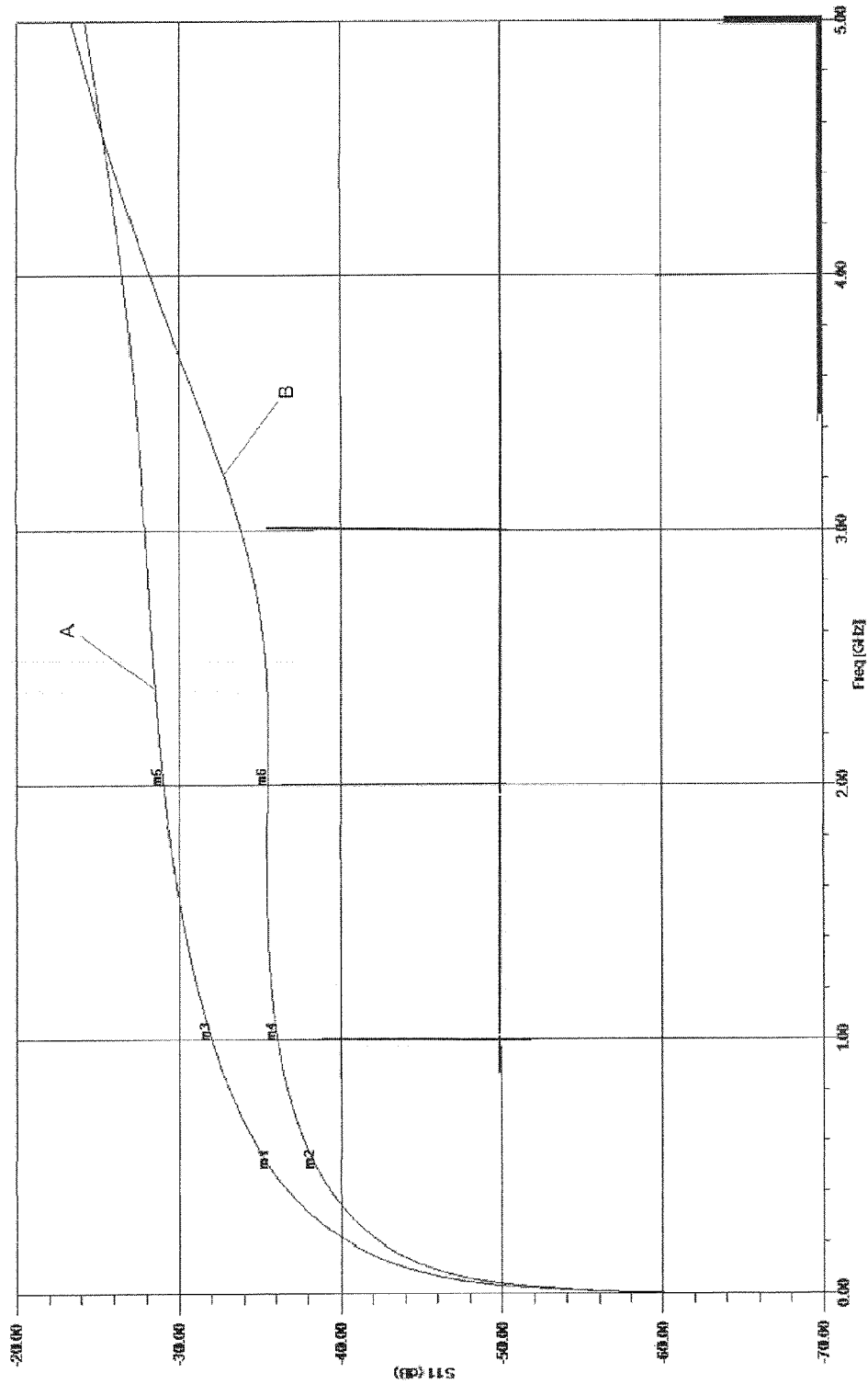
FIG. 6 depicts a comparison of the return loss for a trace routing over a reference plane containing voids associated with vias using the traditional approach versus a trace routing that uses an embodiment of the present invention.

FIG. 6 depicts a comparison of the return loss for the trace routing of traces 220 and 420 over reference plane 125. The comparison is based on the simulations described above, and provides a "before and after" illustration of the benefits of an embodiment of the present invention. Simulated return losses of traces 220, 420 are illustrated by curves A and B respectively in FIG. 6. Thus, curve A illustrates the return loss of a trace (i.e., trace 220) that maintains a constant transmission line width while traversing a void in reference plane 125. Conversely, curve B illustrates the return loss of a trace (i.e., trace 420) that has been routed over a void associated with via 240, but includes an embodiment of the present invention. As one can readily see, the return loss for trace 420 that includes an embodiment of the present invention shows a performance that is far superior to that of an uncorrected trace (e.g., 220). Simulations also reveal that when using a driver sourcing bit rates of 1.6 Gbps with 10 ps pulse jitter and rise and fall times of 50 ps, the opening in the resulting eye patterns is 14.1 ps wider for trace 420 (using an embodiment of the present invention) than that obtained for trace 220 (that does not use an embodiment of the present invention).

Alternatively, in another embodiment of the present invention, the length of the widened trace width can be optimized to minimize the impedance mismatch of the trace involved. Thus, the length of portion 425 of trace 420 can be independently adjusted (in the design phase) to be either longer or shorter than the length of the trajectory that passes directly over the underlying void, with the adjusted length being optimal for its respective trace 420.

In a further embodiment of the present invention, different shapes of transmission line adjustment can be deployed in the vicinity of the void. Such different transmission line shapes include non-rectangular increases to trace width. Thus for example, curved extensions, as well as rectangular and other polygonal extensions to the trace width are within the scope of the present invention. Common to these such shape extensions are deployed in the vicinity of the void to offset the localized impedance change resulting from the reference plane void. Common to these trace width extensions, including non-rectangular shape extensions, is that their dimensions are related to the size of the void so that the resulting offsetting impedance change is commensurate with the discontinuity associated with the void.

In still further embodiments of the present invention, changes to trace width, including non-rectangular shape extensions, can also be used to offset the effects of reference plane discontinuities other than those associated with the voids associated with vias.

In yet still further embodiments of the present invention, the same approach can be used to any package or printed circuit routing scenario whereupon a reference plane layer incurs a discontinuity. In such a scenario, the signal trace width can be adjusted to optimize its width and/or shape to reduce the impact of the associated reference plane discontinuity. Thus, for example, embodiments of the present invention apply to all relevant transmission lines, including microstrip, stripline, differential microstrip, differential stripline, and coplanar transmission lines.

In still further embodiments of the present invention, the same approach can be used to scenario wherein voids are created in the reference plane. Thus, in addition to situations where voids are the result of vias, voids can be the result of degassing holes in packages (used to address thermal issues), ball grid pads in packages, connector and DC blocking pads in printed circuits. In all of these situations, embodiments of the present invention apply for addressing the impact of the resulting voids on the integrity of the transmission lines that use the affected reference plane.

FIG. 7 provides a flowchart of an exemplary method 700 that uses a transmission line width extension to offset the signal degradation effects of a void in a reference plane, according to an embodiment of the present invention.

The process begins at step 710. In step 710, a first metal layer is disposed on a first dielectric layer, wherein the first metal layer provides a reference plane that has a void. A typical first metal layer would be 125 placed on first dielectric layer 130, as shown in FIG. 1, with void shown associated with via 240 shown in FIG. 4A.

In step 720, a second dielectric layer is provided on the first metal layer. A typical second dielectric layer would be 120 in FIG. 1.

In step 730, a second metal layer would be disposed on the second dielectric layer, where the second metal layer supports a trace, a portion of which is routed over a void in the reference plane, with the portion having an increased capacitance relative to a remainder of the trace. An example second metal layer would be 115 in FIG. 1, with trace 420 in FIG. 4A.

At step 740, method 700 ends.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A substrate, comprising:
   a first dielectric layer;
   a first metal layer disposed on the first dielectric layer, wherein the first metal layer comprises a reference plane having a void, wherein the void in a cutout region with interior metal;
   a second metal layer comprising a trace, wherein the trace is unconnected with the void, and a portion of the trace is routed above the void in the reference plane, the portion traversing an entirety of the void, with the portion having an increased capacitance relative to a remainder of the trace; and
   a second dielectric layer arranged between the first and second metal layers.

2. The substrate of claim 1, wherein the first dielectric layer is a core layer.

3. The substrate of claim 1, wherein the trace and reference plane form at least a part of one of a microstrip transmission line.

4. The substrate of claim 1, wherein the trace and reference plane form at least a part of one of a stripline transmission line.

5. The substrate of claim 1, wherein the portion having an increased capacitance results in a decreased impedance of an associated transmission line formed by the trace and reference plane.

6. The substrate of claim 1, wherein the void corresponds to at least one of a via, a connector pad, a DC blocking pad, and a ball grid pad.

7. The substrate of claim 6, wherein the via is configured to form a part of a circuit to couple to one of power, ground, and signal around the substrate.

8. The substrate of claim 1, wherein the increased capacitance is associated with the portion of the trace having an increased width in a lateral direction of the trace relative to a second portion that is not routed above the void.

9. The substrate of claim 8, wherein the increased width results in a rectangular polygon whose length is substantially equal to a traversal dimension of the void.

10. The substrate of claim 8, wherein the increased width results in the portion of the trace having a non-rectangular shape.

11. A method of manufacturing a substrate, comprising:
    disposing a first metal layer disposed on a first dielectric layer, wherein the first metal layer comprises a reference plane having a void, wherein the void includes a cutout region with interior metal;
    disposing a second dielectric layer on the first metal layer; and
    disposing a second metal layer on the second dielectric layer such that the second dielectric layer is arranged between the first and second metal layers, wherein the second metal layer comprises a trace, wherein the trace is unconnected with the void, and wherein a portion of the trace is routed above the void in the reference plane, the portion traversing an entirety of the void, with the portion having an increased capacitance relative to a remainder of the trace.

12. The method of claim 11, wherein the first dielectric layer is a core layer.

13. The method of claim 11, wherein the trace and reference plane form at least a part of one of a microstrip transmission line.

14. The method of claim 11, wherein the trace and reference plane form at least a part of one of a stripline transmission line.

15. The method of claim 11, wherein the portion having an increased capacitance results in a decreased impedance of an associated transmission line formed by the trace and reference plane.

16. The method of claim 11, wherein the void corresponds to at least one of a via, a connector pad, a DC blocking pad, and a ball grid pad.

17. The method of claim 16, wherein the via is configured to form a part of a circuit to couple to one of power, ground, and signal around the substrate.

18. The method of claim 11, wherein the increased capacitance is associated with the portion of the trace having an increased width in a lateral direction of the trace relative to the remainder of the trace.

19. The method of claim 18, wherein the increased width results in a rectangular polygon whose length is substantially equal to a traversal dimension of the void.

20. The method of claim 18, wherein the increased width results in the portion of the trace having a non-rectangular shape.

* * * * *

UNITED STATES PATENT AND TRADEMARK OFFICE
CERTIFICATE OF CORRECTION

PATENT NO.       : 8,669,830 B2  
APPLICATION NO.  : 13/006643  
DATED            : March 11, 2014  
INVENTOR(S)      : Shengli Lin Page 1 of 1

It is certified that error appears in the above-identified patent and that said Letters Patent is hereby corrected as shown below:

In the Claims

Claim 1, Column 7, Line 22, replace "wherein the void in a cutout region" with --wherein the void includes a cutout region--.

Signed and Sealed this
Tenth Day of June, 2014

Michelle K. Lee
*Deputy Director of the United States Patent and Trademark Office*